US008872687B1

(12) United States Patent
Lin et al.

(10) Patent No.: US 8,872,687 B1
(45) Date of Patent: Oct. 28, 2014

(54) DIGITAL TO ANALOG CONVERTING METHOD AND CONVERTER INSENSITIVE TO CODE-DEPENDENT DISTORTIONS

(71) Applicant: National Cheng Kung University, Tainan (TW)

(72) Inventors: Wei-Te Lin, Hsinchu County (TW); Hung-Yi Huang, Tainan (TW); Tai-Haur Kuo, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 14/025,435

(22) Filed: Sep. 12, 2013

(51) Int. Cl.
 *H03M 1/66* (2006.01)
 *H03M 1/06* (2006.01)
(52) U.S. Cl.
 CPC .............. *H03M 1/66* (2013.01); *H03M 1/0673* (2013.01); *H03M 1/0675* (2013.01)
 USPC .......................................... 341/144; 341/118
(58) Field of Classification Search
 CPC .... H03M 1/0673; H03M 1/0675; H03M 1/74
 USPC ................................................ 341/118, 144
 See application file for complete search history.

(56) References Cited

U.S. PATENT DOCUMENTS

| 6,061,010 A * | 5/2000 | Adams et al. ................. 341/144 |
| 6,476,748 B1 * | 11/2002 | Galton ........................... 341/144 |
| 7,042,379 B2 | 5/2006 | Choe |
| 7,576,675 B1 | 8/2009 | Lee et al. |
| 7,679,539 B2 | 3/2010 | Lee et al. |
| 7,907,072 B1 | 3/2011 | Kimura |
| 8,159,381 B2 * | 4/2012 | Parida et al. ................. 341/144 |
| 2013/0063294 A1 | 3/2013 | Lin et al. |

* cited by examiner

*Primary Examiner* — Khai M Nguyen
(74) *Attorney, Agent, or Firm* — Birch, Stewart, Kolasch & Birch, LLP

(57) ABSTRACT

A digital to analog converting method insensitive to code-dependent distortions is implemented by a digital to analog converter (DAC) having a plurality of unit current sources. A plurality of binary-weighted input codes are received by the DAC and rotated to generate dynamic element matched (DEM) encoded signals. Between the adjacent DEM encoded signals is a purposely added pre-determined return-to-zero (RTZ) code. When the DAC generates analog outputs according to the alternately received DEM encoded signals and the RTZ codes, a zero-voltage phase during the level transition of the analog outputs is obtained by the RTZ codes. With the DEM encoded signals and the RTZ codes, each level transition is independent. Furthermore, code-dependent problems such as mismatch- and transient-related distortion are mitigated by the DEM encoded signals.

15 Claims, 7 Drawing Sheets

DIGITAL TO ANALOG CONVERTING METHOD AND CONVERTER INSENSITIVE TO CODE-DEPENDENT DISTORTIONS

BACKGROUND OF THE INVENTION

1. Field of the Invention

The present invention relates to a digital to analog (D/A) converting method and a D/A converter, and more particularly to a D/A converting method and a D/A converter with mismatch and glitch insensitivity.

2. Description of the Prior Art

With reference to FIG. 5, a digital to analog converter (DAC) is mainly comprised of a current source array 200 including a plurality of unit current sources 201 for converting received digital binary-weighted input codes to analog signals. The circuit architecture of a single unit current source 201 is shown in FIG. 6 as an example, mainly having a pair of current switches $M_{sw,p}$ and $M_{sw,n}$ and current sources.

With reference to FIG. 7, when the DAC receives a 3-bit binary-weighted input code $B_2$-$B_3$, seven unit current sources $U_7$-$U_1$ will be controlled by the binary-weighted input code $B_2$-$B_0$. The first digit $B_2$ of the binary-weighted input code controls the unit current sources $U_7$-$U_4$, the second digit $B_1$ controls the unit current sources $U_3$-$U_2$, and the third digit $B_0$ controls the unit current source $U_1$.

In accordance with the conventional digital return-to-zero (DRZ) technique as shown in FIG. 8, three current groups ($U_7$, $U_6$, $U_5$, $U_4$), ($U_3$, $U_2$), ($U_1$) are permanently fixed and respectively correspond to the three digits $B_2$, $B_1$ and $B_0$. For a 3-bit binary-weighted input code, either "100" or "011" can be selected as a mid-code. According to the DRZ method, the binary-weighted input codes and the mid-code are alternately input to the DAC during a signal phase and a return-to-zero (RTZ) phase respectively. As can be seen, for the same binary-weighted input codes encountered again, the unit current source switched by the mid-code is always the same. For example, if the received binary-weighted input code is "101" and the mid-code is "100", the unit current source "$U_1$" is always selected and switched by the mid-code. In other words, the switching transient induced glitches are correlated with the received binary-weighted input codes. This correlation induced distortion tones will degrade the spurious free dynamic range (SFDR) of the DAC.

To overcome the shortcomings of the transition nonlinearity, the present invention develops a D/A converting method to implement the digital return-to-zero with randomization function, whereby the glitches causes by switching transient can be immunized.

SUMMARY OF THE INVENTION

The main objective of the present invention is to provide a method for converting digital to analog data, wherein the glitch problems causes by switching transient can be immunized and the current mismatch is also randomized by the randomization function.

According to an aspect of the present invention, the method for converting digital data to analog data is implemented by a digital to analog converter (DAC) having a plurality of unit current sources and two output nodes, and the method comprises the steps of:

receiving a plurality of binary-weighted input codes and generating a respective random rotation number for each binary-weighted input code, wherein each binary-weighted input code is interpreted as a unit current control code for selecting and controlling the plurality of the unit current sources;

rotating each unit current control code of each binary-weighted input code according to the respective random rotation number for generating rotated digital codes;

inserting a pre-determined return-to-zero (RTZ) code after each rotated digital code; and producing analog signals by the plurality of the unit current sources selected and controlled by the rotated digital codes and the pre-determined RTZ code.

According to another aspect of the present invention, a D/A converter using the foregoing method is provided.

The D/A converter comprises a first dynamic element matching (DEM) encoder receiving a plurality of binary-weighted input codes and generating DEM encoded signals based on the binary-weighted input codes received; a current source array connected to the first DEM encoder and comprising a plurality of unit current sources and receiving the DEM encoded signals and pre-determined return-to-zero (RTZ) signals alternately during signal phases and RTZ phases; wherein the plurality of unit current sources generate analog outputs based on the received DEM encoded signals and the pre-determined RTZ codes.

In accordance with the present invention, even though the DAC encounters the same binary-weighted input codes, different unit current sources will be switched during the RTZ phase. Hence, transition nonlinearity is suppressed. Furthermore, code-dependent issues such as the mismatch- and transient-related distortion can be mitigated due to the characteristics of the dynamic element matching (DEM) technique.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
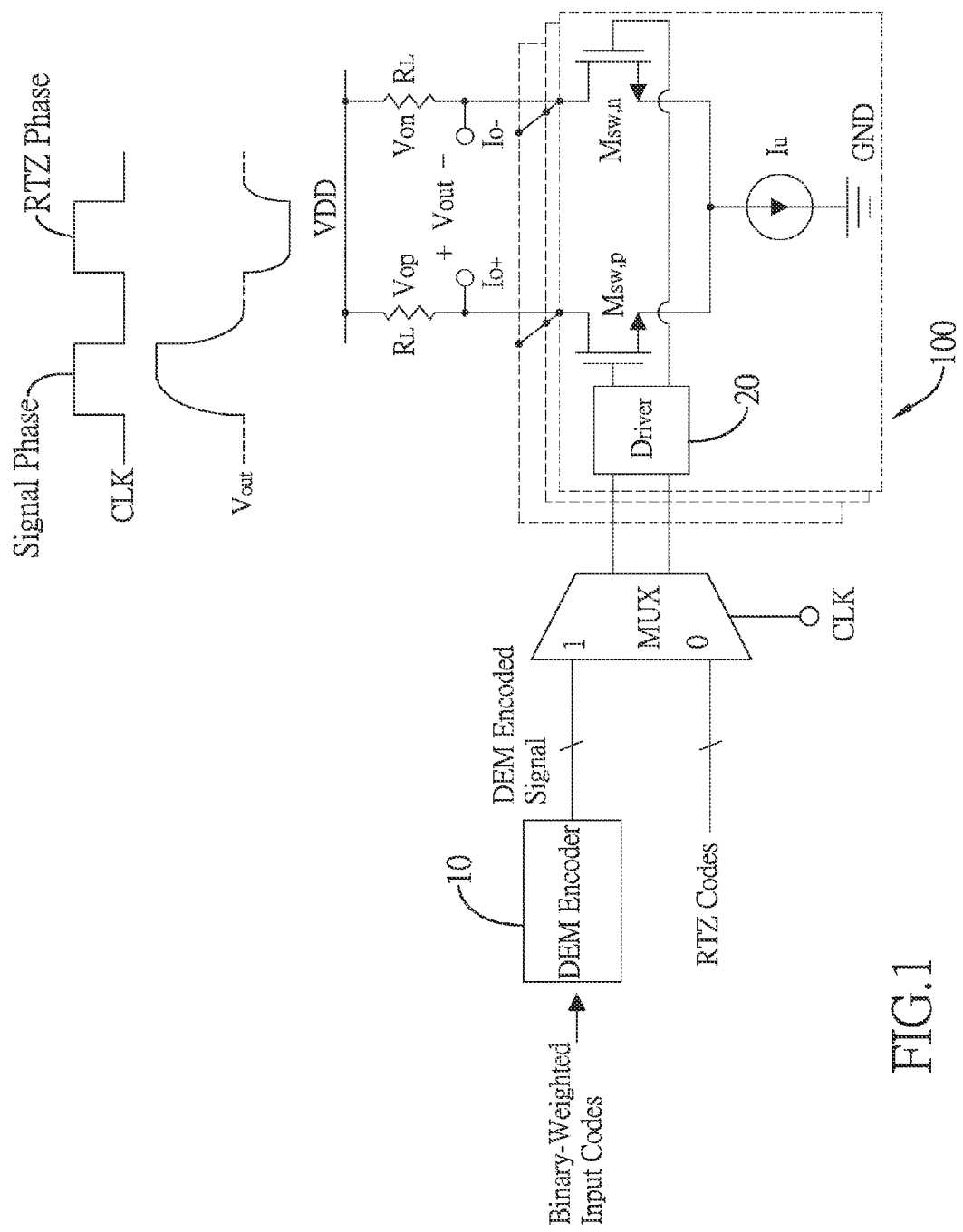
FIG. 1 shows a first preferred embodiment of a digital to analog converter (DAC) for performing the method of the present invention.

With reference to FIG. 1, an example of a digital to analog converter (DAC) for performing the method of the present invention is shown. The DAC mainly comprises a dynamic element matching (DEM) encoder 10 and a current source array 100. The current source array 100 outputs a differential voltage $V_{out}$ from a positive output node $I_{O+}$ and a negative output node $I_{O-}$. The current source array 100 is comprised of multiple unit current sources. Each of the unit current sources has a switch driver 20 and a pair of current switches $M_{sw,p}$ and $M_{sw,n}$ and a current source $I_u$.

The DEM encoder 10 receives the binary-weighted input code and generates a DEM encoded signal. The current source array 100 alternately receives the DEM encoded signal and a predetermined return-to-zero (RTZ) code during a signal phase and a RTZ phase in a clock cycle. The DEM encoded signals are available from any randomization methodology and are not limited to any particular DEM technique. During the signal phase, the DEM encoded signals are passed to the switch drivers 20 of the unit current sources. The switch drivers 20 thus generate complementary driving signals to control current switches $M_{sw,p}$ and $M_{sw,n}$. During the RTZ phase, the RTZ code is passed to the switch drivers 20 and controls the current switches $M_{sw,p}$ and $M_{sw,n}$.

Figure 2:
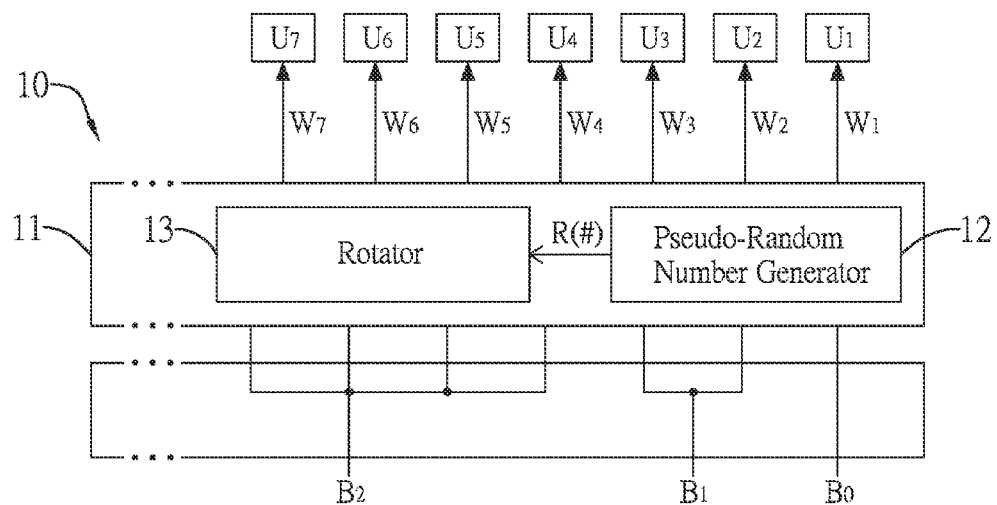
FIG. 2 is a block circuit diagram of a DEM encoder of the present invention.

With reference to FIG. 2, a DEM encoder 10 is proposed here as an example for producing the DEM encoded signal. The DEM encoder 10 comprises a random rotation unit 11. The random rotation unit 11 receives the binary-weighted input code $B_2B_0$ and generates rotated digital outputs $W_7$-$W_1$ as the DEM encoded signal according to a random rotation number R(#). The random rotation unit 11 comprises a pseudo-random number generator 12 and a rotator 13. The pseudo-random number generator 12 generates the random rotation number R(#), wherein # represents the number of rotation steps randomly generated. For a 3-bit binary-weighted input code $B_2$-$B_0$, the number of rotation steps is in a range of 0 to 6, where 7 equals 0 in the 3-bit case and no rotation step will be made. The binary-weighted input code $B_2$-$B_0$ can be interpreted as a unit current control code for selecting and controlling the corresponding unit current sources. For example, a binary-weighted input code "101" can be converted to the unit current control code "1111001" to select unit current sources $U_7$, $U_6$, $U_5$, $U_4$ and $U_1$ correspondingly. The rotator 13 rotates the unit current control code according to the random rotation number R(#) in either a leftward-rotating direction or a rightward-rotating direction.

Figure 3A:
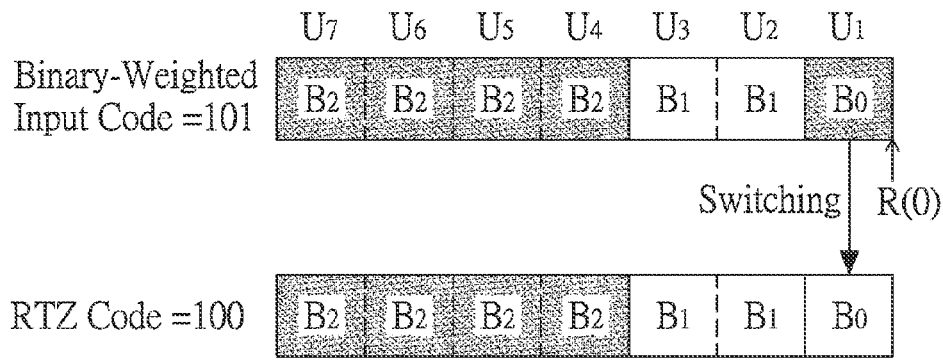
FIG. 3A shows the transition from the signal phase to the RTZ phase, wherein the random rotation number for the received binary-weighted input code is 0.

With reference to FIG. 3A, when the received binary-weighted input code is "101" and the generated random rotation number is R(0), five unit current sources $U_7$, $U_6$, $U_5$, $U_4$ and $U_1$ will be selected and no rotation is performed during the signal phase. The digit $B_2$ of the binary-weighted input controls the four unit current sources $U_7$, $U_6$, $U_5$, $U_4$ while the digit $B_0$ controls the unit current source $U_1$. If a mid-code "100" is selected as the predetermined return-to-zero (RTZ) code, four unit current sources $U_7$, $U_6$, $U_5$ and $U_4$ will be selected during the subsequent RTZ phase. Obviously, the unit current source $U_1$ is switched while the signal phase is transiting to the RTZ phase.

Figure 3B:
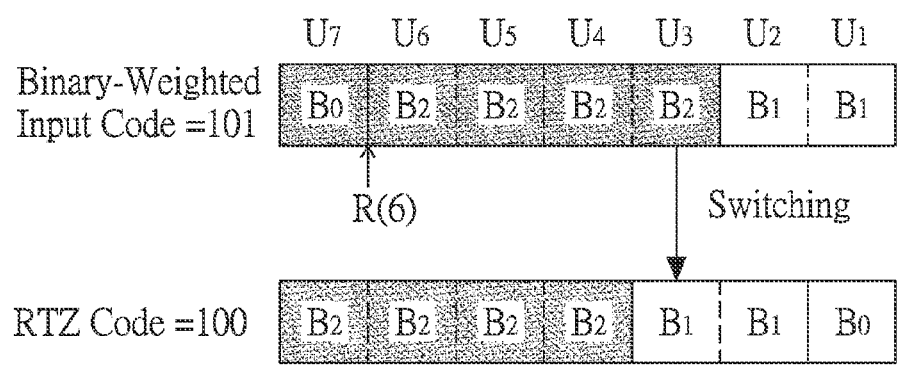
FIG. 3B shows the transition from the signal phase to the RTZ phase, wherein the random rotation number for the received binary-weighted input code is 6.

With reference to FIG. 3B, as the same binary-weighted input code is "101", when the random rotation number is R(6), the original unit current control code is rotated to "1111100". Therefore, five different unit current sources $U_7$, $U_6$, $U_5$, $U_4$ and $U_3$ will be selected because a 6-step rotation is performed during the signal phase. It is noted that the original sequence of the unit current sources $U_7$-$U_1$ is changed to a new sequence. The digit $B_2$ of the binary-weighted input code controls the four unit current sources $U_6$, $U_5$, $U_4$ and $U_3$ while the digit $B_0$ controls the unit current source $U_7$. The same mid-code "100" is used as the predetermined return-to-zero (RTZ) code. Therefore, the four unit current sources $U_7$, $U_6$, $U_5$ and $U_4$ will be selected during the subsequent RTZ phase. The unit current source $U_3$ is switched while the signal phase is transiting to the RTZ phase.

Figure 3C:
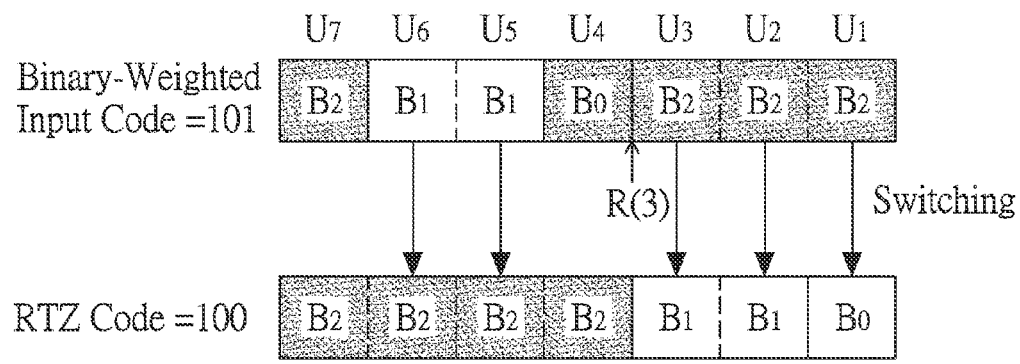
FIG. 3C shows the transition from the signal phase to the RTZ phase, wherein the random rotation number for the received binary-weighted input code is 3.

With reference to FIG. 3C, as the same binary-weighted input code is "101", if the random rotation number is R(3), the five unit current sources $U_7$ and $U_4$-$U_1$ will be selected because a 3-step rotation is performed during the signal phase. The digit $B_2$ of the binary-weighted input controls the four unit current sources $U_7$, $U_3$, $U_2$ and $U_1$ while the digit $B_0$ controls the unit current source $U_4$. The same mid-code "100" is used as the RTZ code, four unit current sources $U_7$, $U_6$, $U_5$ and $U_4$ will be selected during the subsequent RTZ phase. In this case, the switched unit current sources are U6, U5, U3, U2 and U1, and which are different from those that are switched in last case.

According to the examples as shown on FIGS. 3A to 3C, even though the received binary-weighted input codes are the same, different unit current sources will be switched during the RTZ phases because of the randomly generated rotation step. In other words, the current switching of the unit current sources is randomized. Hence, transition nonlinearity is suppressed. Furthermore, code-dependent issues such as the mismatch- and transient-related distortion can be mitigated due to the characteristics of the DEM technique.

Figure 4:
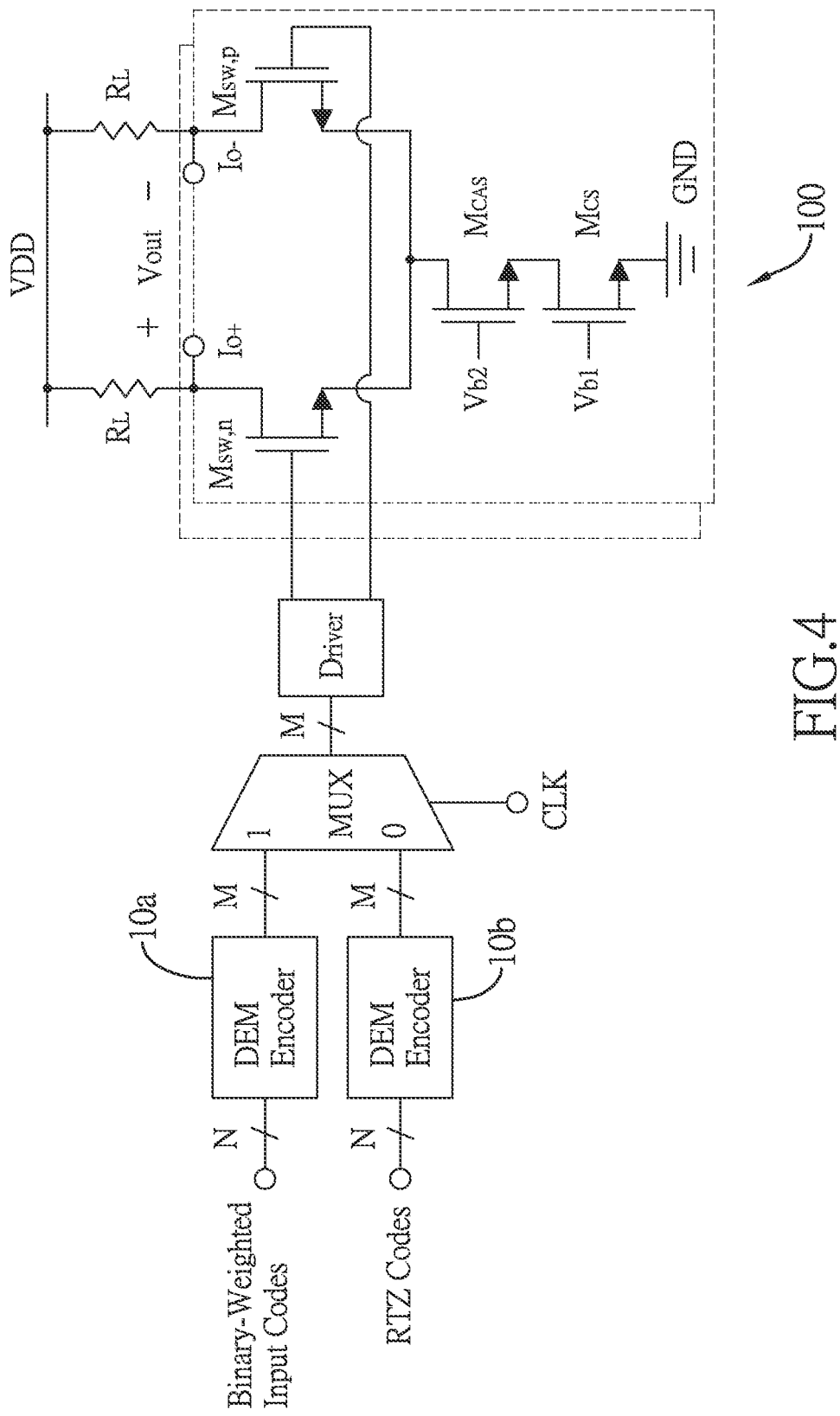
FIG. 4 shows a second preferred embodiment of a digital to analog converter (DAC) for performing the method in accordance with the present invention.
Figure 5:
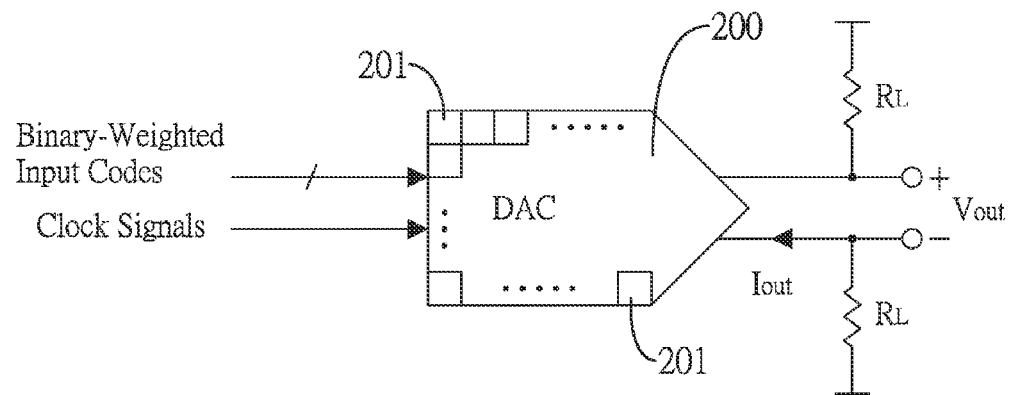
FIG. 5 shows an exemplary circuit diagram of a digital to analog converter (DAC) in accordance with the prior art.
Figure 6:
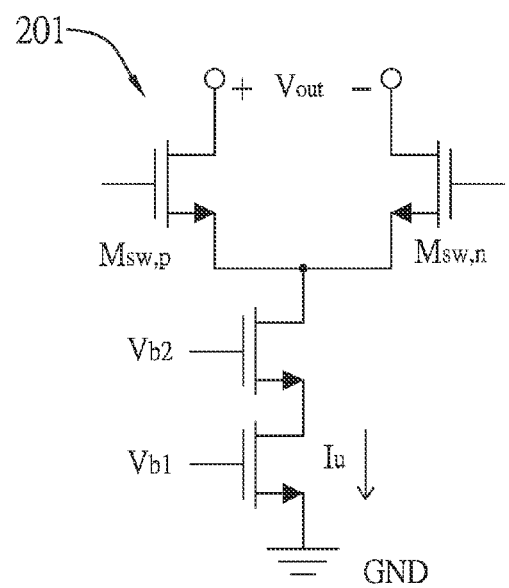
FIG. 6 shows a circuit diagram of a single unit current source in the DAC of FIG. 5.
Figures 7, 8:
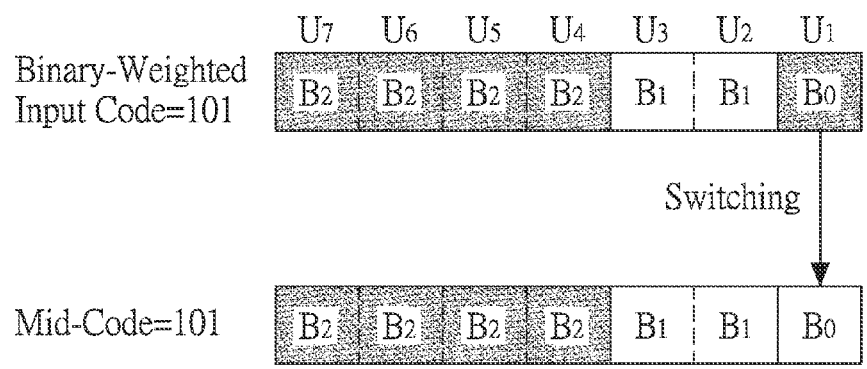
FIG. 7 shows the relationships of a binary-weighted input code $B_2$-$B_0$ and unit current sources $U_7$-$U_1$.
FIG. 8 shows an example of the unit current source switching based on conventional DRZ technique.

With reference to FIG. 4, in accordance with a second preferred embodiment, a first DEM encoder 10a receives and rotates the binary-weighted input code to generate the DEM encoded signal as described above. A second DEM encoder 10b is further implemented in this embodiment for receiving and rotating the RTZ code and producing the randomly rotated RTZ code. The DEM encoded signal and the randomly rotated RTZ code are alternately input to the current source array 100. As a result, the average output current flowing through the positive output $I_{O+}$ will closely approximate to that flowing through the negative output node $I_{O-}$. Thus, the differential output voltage $V_{out}$ between the two nodes $I_{O+}$ and $I_{O-}$ is almost zero during the RTZ phase.

For a 3-hit DAC, when the mid-code "100" is selected as the RTZ code, $2^2=4$ unit current sources will be selected during the RTZ phase and switched to the positive output nodes $I_{O+}$. Since "011" is complementary to the mid-code "100", $2^2-1=3$ current cells will be switched to the negative output node $I_{O-}$. If an extra unit current source is added to the output node that has a lower current level, i.e. the negative output node $I_{O-}$ in this example, a true zero differential output $V_{out}=0$ can be obtained during the RTZ phase.

Figure 9A:
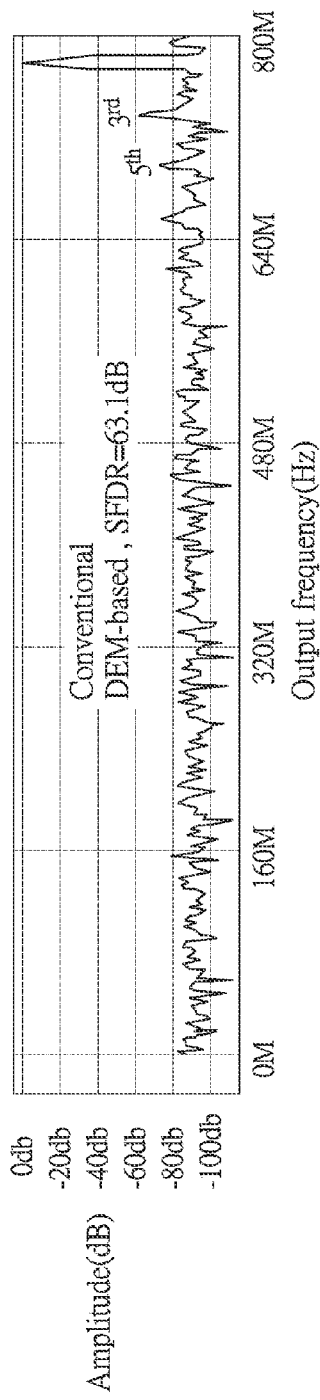
FIG. 9A shows a simulation waveform of SFDR performance according to the conventional DEM-based D/A converting method.
Figure 9B:
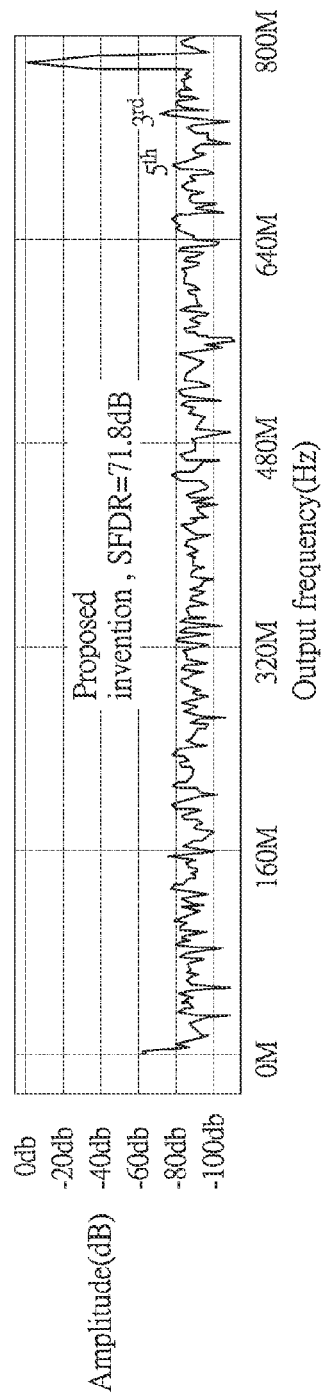
FIG. 9B shows a simulation waveform of SFDR performance according to the present invention.

With reference to FIGS. 9A and 9B, two SPICE (simulation program with integrated circuit emphasis) simulation waveforms are shown for the conventional DEM-based conversion method and the method of the present invention. In these two simulations, 4% mismatch is applied to the whole switch and the current source array. According to the DEM-based conversion method in FIG. 9A, the transition nonlinearity dominates the SFDR performance with 63 dB. By contrast, as shown in FIG. 9B, the SFDR performance of the present invention is improved to about 72 dB.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A digital to analog converting method insensitive to code-dependent distortions, the method being implemented by a digital to analog converter (DAC) having a plurality of unit current sources and two output nodes, the method comprising the steps of:
   receiving a plurality of binary-weighted input codes and generating a respective random rotation number for each binary-weighted input code, wherein each binary-weighted input code is interpreted as a unit current control code for selecting and controlling the plurality of the unit current sources;
   rotating each unit current control code of each binary-weighted input code according to the respective random rotation number for generating rotated digital codes;
   inserting a pre-determined return-to-zero (RTZ) code after each rotated digital code; and
   producing analog signals by the plurality of the unit current sources selected and controlled by the rotated digital codes and the pre-determined RTZ code.

2. The method as claimed in claim 1, wherein the step of rotating each unit current control code and the step of inserting the pre-determined RTZ code are performed in a clock cycle containing a signal phase and a return-to-zero (RTZ) phase.

3. The method as claimed in claim 2, wherein each binary-weighted input code and the pre-determined RTZ code are both comprised of N bits, and a most significant bit (MSB) of the pre-determined RTZ code is 1 while other bits of the pre-determined RTZ code are 0.

4. The method as claimed in claim 2, wherein each binary-weighted input code and the pre-determined RTZ code are both comprised of N bits, and a most significant bit (MSB) of the pre-determined RTZ code is 0 while other bits of the pre-determined RTZ are 1.

5. The method as claimed in claim 3, wherein the step of rotating each unit current control code is performed during the signal phase; and the step of inserting the pre-determined RTZ code is performed during the RTZ phase subsequent to the signal phase of the same clock cycle.

6. The method as claimed in claim 4, wherein the step of rotating each unit current control code is performed during the signal phase; and the step of inserting the pre-determined RTZ code is performed during the RTZ phase subsequent to the signal phase of the same clock cycle.

7. The method as claimed in claim 1, wherein the step of inserting the pre-determined RTZ code further comprises:
   rotating the pre-determined RTZ code according to a second random rotation number.

8. The method as claimed in claim 5, wherein the plurality of the unit current sources are selected and controlled to output analog outputs from the two output nodes of the DAC, and the step of producing the analog signals further comprises:
   adding an extra unit current source during the RTZ phase to one of the two output nodes, which has a lower current level than that of the other output node, so as to obtain a zero differential output voltage during the RTZ phase.

9. The method as claimed in claim 6, wherein the plurality of the unit current sources are selected and controlled to output analog outputs from the two output nodes of the DAC, and the step of producing the analog signals further comprises:
   adding an extra unit current source during the RTZ phase to one of the two output nodes, which has a lower current level than that of the other output node, so as to obtain a zero differential output voltage during the RTZ phase.

10. The method as claimed in claim 1, wherein the unit current control codes of the binary-weighted input codes are rotated in either a leftward-rotating direction or a rightward-rotating direction.

11. The method as claimed in claim 3, wherein the random rotation number is smaller than N.

12. A digital to analog converter insensitive to code-dependent distortions comprising:
   a first dynamic element matching (DEM) encoder receiving a plurality of binary-weighted input codes and generating DEM encoded signals based on the binary-weighted input codes received;
   a current source array connected to the first DEM encoder and comprising a plurality of unit current sources and receiving the DEM encoded signals and pre-determined return-to-zero (RTZ) codes alternately during signal phases and RTZ phases;
   wherein the plurality of unit current sources generate analog outputs based on the received DEM encoded signals and the pre-determined RTZ codes.

13. The converter as claimed in claim 12 further comprising:
   a second dynamic element matching (DEM) encoder receiving the pre-determined RTZ codes and randomly rotating the pre-determined RTZ codes, wherein the pre-determined RTZ codes being randomly rotated are input to the plurality of unit current sources for generating the analog outputs.

14. The converter as claimed in claim 12, wherein the plurality of unit current sources output the analog outputs from two output nodes; and an extra unit current source is connected to one of the output nodes, which has a lower current level than that of the other output node, so as to obtain a zero differential output voltage during the RTZ phases.

15. The converter as claimed in claim 13, wherein the plurality of unit current sources output the analog outputs from two output nodes; and an extra unit current source is connected to one of the output nodes, which has a lower current level than that of the other output node, so as to obtain a zero differential output voltage during the RTZ phases.

* * * * *